(12) United States Patent
Lee et al.

(10) Patent No.: US 7,842,623 B2
(45) Date of Patent: Nov. 30, 2010

(54) COMPOSITION FOR REMOVING AN INSULATION MATERIAL AND RELATED METHODS

(75) Inventors: Chun-Deuk Lee, Hwaseong-si (KR); Jung-Jea Myung, Iksan-si (KR); Myun-Kyu Park, Iksan-si (KR); Dong-Min Kang, Uiwang-si (KR); Byoung-Woo Son, Yongin-si (KR); Masayuki Takashima, Iksan-si (JP); Young-Nam Kim, Suwon-si (KR); Hyun-Joon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/494,572

(22) Filed: Jun. 30, 2009

(65) Prior Publication Data

US 2009/0305931 A1    Dec. 10, 2009

Related U.S. Application Data

(62) Division of application No. 11/500,434, filed on Aug. 8, 2006, now Pat. No. 7,566,666.

(30) Foreign Application Priority Data

Aug. 8, 2005    (KR) ............. 10-2005-0072471

(51) Int. Cl.
*H01L 21/00* (2006.01)
*C11D 7/32* (2006.01)

(52) U.S. Cl. .................. 438/800; 510/175

(58) Field of Classification Search ............ 510/175; 438/800
See application file for complete search history.

(56) References Cited

U.S. PATENT DOCUMENTS

| 3,036,885 | A  | 5/1962 | Muller et al. |
|---|---|---|---|
| 6,017,811 | A  | 1/2000 | Winton et al. |
| 6,391,794 | B1 | 5/2002 | Chen et al. |
| 6,573,175 | B1 | 6/2003 | Yin et al. |
| 6,693,047 | B1 | 2/2004 | Lu et al. |
| 6,890,391 | B2 | 5/2005 | Aoki et al. |
| 6,896,744 | B2 | 5/2005 | Morinaga et al. |
| 7,208,325 | B2 | 4/2007 | Wang et al. |
| 2007/0082497 | A1 | 4/2007 | Lee et al. |

FOREIGN PATENT DOCUMENTS

| JP | 2001065459 | 3/2001 |
|---|---|---|
| JP | 2002134468 | 5/2002 |
| JP | 2002246378 | 8/2002 |
| JP | 2004325918 | 11/2004 |
| JP | 2005167181 | 6/2005 |
| KR | 1998070026 | 10/1998 |
| KR | 1020020055888 A | 7/2002 |
| KR | 1020020081923 A | 10/2002 |
| KR | 1020040077043 A | 9/2004 |
| KR | 1020040102981 A | 12/2004 |

*Primary Examiner*—Lex Malsawma
(74) *Attorney, Agent, or Firm*—Volentine & Whitt, PLLC

(57) ABSTRACT

A composition for removing an insulation material and related methods of use are disclosed. The composition comprises about 1 to 50 percent by weight of an oxidizing agent, about 0.1 to 35 percent by weight of a fluorine-containing compound, and water. The insulation material comprises at least one of a low-k material and a protection material.

20 Claims, 3 Drawing Sheets

COMPOSITION FOR REMOVING AN INSULATION MATERIAL AND RELATED METHODS

CROSS-REFERENCE TO RELATED APPLICATION

This is a divisional of application Ser. No. 11/500,434 filed on Aug. 8, 2006, which is incorporated herein by reference in its entirety.

BACKGROUND OF THE INVENTION

1. Field of the Invention

Exemplary embodiments of the present invention relate to a composition for removing an insulation material, and related methods. In particular, exemplary embodiments of the present invention relate to a composition for removing an insulation material that may effectively remove a low-k film and a protection film with reduced damage to a substrate on which the films are formed, a method of removing an insulation layer, and a method of recycling a substrate.

This application claims priority to Korean Patent Application No. 2005-72471, filed on Aug. 8, 2005, the subject matter of which is hereby incorporated by reference in its entirety.

2. Description of the Related Art

A demand for semiconductor devices having greater integration densities and higher operating speeds has existed throughout the decades long development of various information processing apparatuses. Thus, developments in semiconductor device fabrication technologies have been directed towards increasing integration, improved reliability, and obtaining higher operating speeds.

As integration densities for semiconductor devices have increased, the respective design rules for semiconductor devices have decreased. Contemporary design rules include, for example, wiring widths of about 100 nm or less. However, as design rules have decreased, RC delay times have increased for wirings and other elements formed according to the decreased design rules. An RC delay time is determined in accordance with the resistance (R) of (e.g.,) a wire and the capacitance (C) of an insulation layer disposed between adjacent wires. An increased RC delay time causes a reduction in semiconductor device operating speed. Therefore, to obtain a semiconductor device having greater integration density and a fast operating speed, either the resistance of the wiring or the dielectric constant (k) of the insulation layer must be reduced.

To reduce the wiring resistance, a conductive material having a low resistivity has been used to form the wiring. For example, a fabrication process has been developed that forms wiring from copper instead of aluminum, since copper has a substantially lower resistivity than aluminum.

An insulation material having a low dielectric constant is also useful in achieving a reduced RC delay time. In a conventional semiconductor device, the insulation layer is generally formed from silicon oxide having a dielectric constant of about 3.9. As the thickness of the insulation layer is reduced, a silicon oxide insulation layer does not effectively isolate adjacent wires, and parasitic capacitance may form between adjacent wires. Therefore, low-k materials having a dielectric constant substantially lower than that of silicon oxide have been developed.

The low-k materials generally have a dielectric constant less than or equal to about 3. Low-k materials may generally be divided into organic low-k materials and inorganic low-k materials, but organic low-k materials are more commonly used in conventional practice. Carbon-doped silicon oxide (SiOCH), silicon oxycarbide (SiOC), hydrogenated silicon oxide (SiOH), BLACK DIAMOND™, methylsilsesquioxane (MSQ), fluorinated silicate glass (FSG), organic silicate glass (OSG), etc., are examples of organic low-k materials.

When an insulation layer is formed using low-k material, the insulation layer may be easily damaged by plasma based fabrication processes subsequently applied to semiconductor devices, such as those commonly used in dry etching processes. Furthermore, the insulation layer formed using low-k material may be porous. A porous insulation layer readily absorbs moisture through the pores, which deteriorates the insulation layer. Thus, a protection layer is generally formed on the insulation layer to prevent deterioration of the insulation layer. The protection layer is formed from a substance such as silicon carbonitride (SiCN), silicon nitride (SiN), silicon carbide (SiC), etc. Additionally, the protection layer may be used as a capping layer formed on a conductive material.

Between and among the lengthy sequence of fabrication processes necessary to form semiconductor devices on a wafer, various inspection processes are performed. For example, when processing a wafer, each process performed on the wafer may also be performed on a dummy wafer, so that, after each process is performed, the thickness and characteristics of a layer formed on the wafer may be estimated using the dummy wafer.

Once a dummy wafer has been used, it may be recycled through a recycling process or discarded; however, recycling the dummy wafer is economically advantageous. This is particularly true of late as commercial wafers have diameters of about 300 mm. These very large wafers are expensive and, thus, recycling dummy wafers become more necessary.

When forming a low-k material layer and/or a protection layer on a wafer, a dummy wafer is used along side the wafer. After performing an inspection process on the dummy wafer, the low-k material layer and/or the protection layer may then be removed from the dummy wafer.

The low-k material layer and/or the protection layer are removed through a dry etching process or a wet etching process. A dry etching process may be performed using plasma, and a wet etching process may be performed using an etching solution. For example, U.S. Pat. No. 6,890,391, discloses a method for removing a low-k material layer and a protection layer using a dry etching process. In the disclosed method, the low-k material layer is formed from silicon oxide, methylsilsesquioxane (MSQ), hydrosilsesquioxane (HSQ), silicon oxycarbide (SiOC) or carbon-doped silicon oxide (SiOCH), and the protection layer is formed using silicon nitride (SiN) or silicon carbonitride (SiCN). Also, Japanese Laid-Open Patent Publication No. 2001-65459 discloses a method of dry etching a low-k material layer comprising silicon oxycarbide (SiOC) using a mixture gases comprising fluorinated carbon gas, nitrogen gas, and an inert gas having a flow rate greater than or equal to about 80%. In addition, Korean Laid-Open Patent Publication No. 2004-102981 discloses a method of removing an insulating interlayer through a plasma etching process using a mixture gas of $CF_4/O_2/Ar$. In the disclosed method, the insulating interlayer comprises an oxide layer, an organic low-k material layer, an organic porous low-k layer, or a combination thereof.

In the above methods of removing the low-k layer and/or the protection layer through a dry etching process, plasma having a high energy level damages the layer underneath the low-k layer and/or the protection layer. Furthermore, recycling a dummy wafer from which a low-k layer and/or a protection layer has been removed using a dry etching process is not economically advantageous.

Korean Laid-Open Patent Publication No. 2002-55888 discloses a method of manufacturing a metal wiring and a capacitor in a semiconductor device. In the disclosed method, an insulation layer formed using silicon oxide, fluorinated silicate glass (FSG), carbon-doped silicon oxide (SiOCH), silicon oxycarbide (SiOC), or hydrogenated silicon oxide (SiOH) is removed using a hydrogen fluoride solution. However, the hydrogen fluoride solution does not sufficiently remove the low-k material from the object on which it is formed. Furthermore, the hydrogen fluoride solution etches a protection material such as silicon carbonitride (SiCN) very little.

Japanese Laid-Open Patent Publication No. 2002-246378 discloses a method of selectively etching a silicon nitride layer and a silicon oxynitride layer using an etching solution relative to a silicon wafer or a silicon oxide layer. In the disclosed method, the etching solution comprises sulfuric acid, ammonium fluoride (or hydrogen fluoride), and less than or equal to about 5 percent by weight of water. The etching process is performed at a temperature greater than or equal to about 150° C. Furthermore, the etching solution comprises excessive sulfuric acid. Thus, etching rates of the silicon nitride layer and the silicon oxynitride layer are not easily controlled, and the stability of the etching solution is reduced.

The subject matter of these background documents is hereby incorporated by reference.

SUMMARY OF THE INVENTION

Exemplary embodiments of the present invention provide a composition for removing an insulation layer without damaging a substrate on which the insulation layer is formed and related methods.

In one embodiment, the invention provides a composition for removing an insulation material comprising about 1 to 50 percent by weight of an oxidizing agent, about 0.1 to 35 percent by weight of a fluorine-containing compound, and water, wherein the insulation material comprises at least one of a low-k material and a protection material.

In another embodiment, the invention provides a composition for removing an insulation material comprising about 1 to 50 percent by weight of at least one peroxy acid compound selected from the group consisting of ammonium persulfate, sodium persulfate, potassium persulfate, peroxynitric acid, peroxyphosphoric acid, peroxysulfuric acid, peroxyboric acid, sodium peroxyborate, peroxyformic acid, peroxyacetic acid, peroxybenzoic acid, and peroxyphthalic acid. The composition further comprises about 0.1 to 35 percent by weight of a fluorine-containing compound, and water.

In yet another embodiment, the invention provides a method of removing an insulation layer from an object, the insulation layer comprising at least one of a low-k material and a protection material, the method comprising removing the insulation layer from the object by applying to the object a composition comprising about 1 to 50 percent by weight of an oxidizing agent, about 0.1 to 35 percent by weight of a fluorine-containing compound, and water.

In still another embodiment, the invention provides a method of recycling a substrate comprising forming an insulation layer on the substrate using at least one of a low-k material and a protection material, and removing the insulation layer from the substrate by applying to the substrate a composition comprising about 1 to 50 percent by weight of an oxidizing agent, about 0.1 to 35 percent by weight of a fluorine-containing compound, and water.

BRIEF DESCRIPTION OF THE DRAWINGS

Embodiments of the invention will be described with reference to the accompanying drawings, in which like reference symbols refer to like or similar elements. In the drawings.

DESCRIPTION OF EMBODIMENTS

Figure 1:
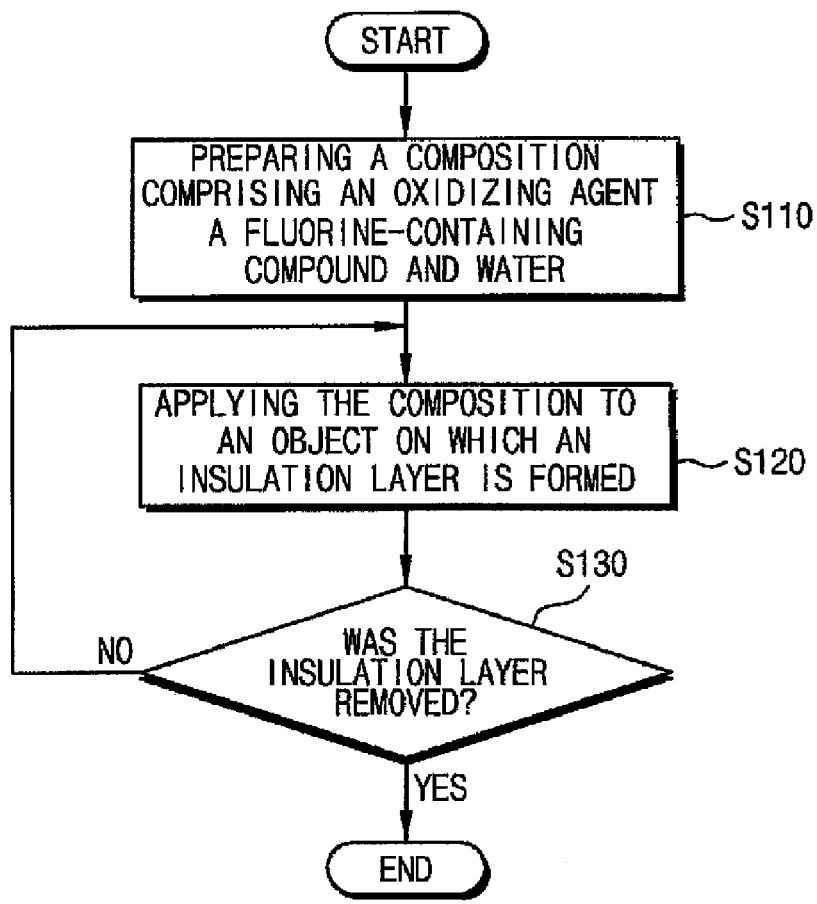
FIG. 1 is a flow chart illustrating a method of removing an insulation layer using a composition in accordance with an embodiment of the invention.

In the drawings, the sizes and relative sizes of layers and regions may be exaggerated for clarity.

It will be understood that when an element or layer is referred to as being "on," "connected to" or "coupled to" another element or layer, it can be directly on, connected, or coupled to the other element or layer; or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be called a second element, component, region, layer, or section, respectively, without departing from the scope of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Composition for Removing an Insulation Material

A composition for removing an insulation material, in accordance with an embodiment of the invention, may remove an insulation layer from a substrate without damaging the substrate. In particular, the composition may effectively remove a low-k film and/or a protection film from the substrate without damaging the substrate. The low-k film may be formed using a low-k material such as carbon-doped silicon oxide (SiOCH), silicon oxycarbide (SiOC), hydrogenated silicon oxide (SiOH), and the like. The protection film may be formed using a protection material such as silicon carbonitride (SiCN), silicon nitride (SiN), silicon carbide (SiC), etc.

A composition in accordance with an embodiment of the invention, which has the characteristics described above, comprises about 1 to 50 percent by weight of an oxidizing agent, about 0.1 to 35 percent by weight of a fluorine-containing compound, and a remainder of water. As used herein, percent or percentage "by weight" means the percent or percentage of the total weight of the resulting composition.

The oxidizing agent of the composition may react with the low-k material and the protection material to generate silicon oxide. The low-k material may be, for example, carbon-doped silicon oxide (SiOCH), silicon oxycarbide (SiOC), hydrogenated silicon oxide (SiOH), etc., or a combination thereof, and the protection material may be, for example, silicon carbonitride (SiCN), silicon nitride (SiN), silicon carbide (SiC), etc., or a combination thereof. As an example, the oxidizing agent may be reacted with silicon carbonitride as shown in the following chemical equation.

$$\text{SiCN} + \text{Oxidizing Agent} \rightarrow \text{SiO}_2 + \text{Byproducts} \quad (1)$$

The reaction of the oxidizing agent with silicon carbonitride generates silicon oxide and byproducts. The byproducts may be readily removed from the substrate.

When a composition comprises about 0.1 to 35 percent by weight of a fluorine-containing compound, water, and less than about 1 percent by weight of the oxidizing agent, the composition may not have a sufficient oxidizing ability, and processing time may increase. In addition, when a composition comprises about 0.1 to 35 percent by weight of a fluorine-containing compound, water, and greater than about 50 percent by weight of the oxidizing agent, the oxidizing agent may not completely dissolve in the water. Thus, a composition in accordance with an embodiment of the invention comprises about 1 to 50 percent by weight of the oxidizing agent, and preferably about 5 to 30 percent by weight of the oxidizing agent.

The oxidizing agent of a composition in accordance with an embodiment of the invention, may be, for example, a peroxy acid compound, a peroxide compound, an oxy acid compound, a metal salt, an acid, etc., or a combination thereof.

The peroxy acid compound may be, for example, ammonium persulfate, sodium persulfate, potassium persulfate, peroxynitric acid, peroxyphosphoric acid, peroxysulfuric acid, peroxyboric acid, sodium peroxyborate, peroxyformic acid, peroxyacetic acid, peroxybenzoic acid, peroxyphthalic acid, etc., or a combination thereof.

The peroxide compound may be, for example, hydrogen peroxide, sodium peroxide, barium peroxide, etc., or a combination thereof.

The oxy acid compound may be, for example, nitric acid, phosphoric acid, chloric acid, hypochlorous acid, sulfuric acid, permanganic acid, chromic acid, dichromic acid, bromic acid, hypobromic acid, iodic acid, hypoiodic acid, or a salt thereof. The oxy acid compound may also be, for example, a combination of the substances listed above with reference to the oxy acid compound.

The metal salt may be, for example, iron(III) chloride, iron(III) sulfate, iron(III) citrate, ammonium iron(III) sulfate, etc., or a combination thereof. The acid may be, for example, acetic acid, hydrochloric acid, etc., or a combination thereof.

In an embodiment of the invention, the oxidizing agent may comprise a peroxy acid compound, which comprises ammonium persulfate, sodium persulfate, potassium persulfate, or a combination thereof.

The fluorine-containing compound of a composition in accordance with an embodiment of the invention may react with silicon oxide to remove silicon oxide from the substrate. For example, hydrogen fluoride may react with silicon oxide as shown in the following chemical equation.

$$6\text{HF} + 2\text{SiO}_2 \rightarrow \text{Si}_2\text{F}_6\text{O} + 3\text{H}_2\text{O} \quad (2)$$

When a composition comprises about 1 to 50 percent by weight of an oxidizing agent, water, and less than about 0.1 percent by weight of the fluorine-containing compound, the ability of the composition to remove silicon oxide may be relatively poor, and processing time may be increased. In addition, when a composition comprises about 1 to 50 percent by weight of an oxidizing agent, water, and greater than about 35 percent by weight of the fluorine-containing compound, a silicon substrate may be damaged when the composition is used on the substrate, and disposal of the waste composition may be limited because the fluorine-containing compound is regulated as hazardous waste. Thus, a composition in accordance with an embodiment of the invention comprises about 0.1 to 35 percent by weight of the fluorine-containing compound, and preferably about 1 to 20 percent by weight of the fluorine-containing compound.

The fluorine-containing compound of a composition in accordance with an embodiment of the invention may be, for example, hydrogen fluoride, ammonium fluoride, ammonium bifluoride, sodium fluoride, sodium hydrogen fluoride, barium fluoride, potassium fluoride, ammonium fluoroborate, etc., or a combination thereof.

In an embodiment of the invention, the composition may comprise hydrogen fluoride as the fluorine-containing compound.

A composition in accordance with an embodiment of the invention also comprises water. The water may be, for example, pure water, deionized water, ultra pure water, etc., or a combination thereof.

A composition in accordance with an embodiment of the invention is used for removing a low-k material and/or a protection material (or a passivation material). The low-k material may be, for example, carbon-doped silicon oxide (SiOCH), silicon oxycarbide (SiOC), hydrogenated silicon oxide (SiOH), or a combination thereof. Particularly, a composition in accordance with an embodiment of the invention may effectively remove carbon-doped silicon oxide (SiOCH).

The protection material may be, for example, silicon carbonitride (SiCN), silicon nitride (SiN), silicon carbide (SiC), or a combination thereof. Additionally, a composition in accordance with an embodiment of the invention may effectively remove silicon carbonitride (SiCN). The silicon carbonitride (SiCN) is conventionally removed through a dry etching process, and an etching solution is not typically used for removing silicon carbonitride (SiCN). However, a composition in accordance with an embodiment of the invention may be used for removing silicon carbonitride (SiCN).

In an embodiment of the invention, the composition for removing an insulation material comprises about 1 to 50 percent by weight of an peroxy acid compound, about 0.1 to 35 percent by weight of a fluorine-containing compound, and a remainder of water. The peroxy acid compound may be, for example, ammonium persulfate, sodium persulfate, potassium persulfate, peroxynitric acid, peroxyphosphoric acid, peroxysulfuric acid, peroxyboric acid, sodium peroxyborate, peroxyformic acid, peroxyacetic acid, peroxybenzoic acid, peroxyphthalic acid, and the like, or a combination thereof. The composition may effectively remove the insulation material such as a low-k material and/or a protection material. Particularly, the composition may advantageously remove silicon carbonitride (SiCN).

Method of Removing an Insulation Layer

FIG. 1 is a flow chart illustrating a method of removing an insulation layer from an object using a composition in accordance with an embodiment of the invention.

Referring to FIG. 1, the method comprises preparing a composition in accordance with an embodiment of the invention, wherein the composition comprises about 1 to 50 percent by weight of an oxidizing agent, about 0.1 to 35 percent by weight of a fluorine-containing compound, and a remainder of water (S110).

A composition in accordance with an embodiment of the invention is prepared by mixing about 1 to 50 percent by weight of an oxidizing agent, about 0.1 to 35 percent by weight of a fluorine-containing compound, and a remainder of water using a stirrer or a circulation system. The composition has been described previously, so further description of the composition will be omitted here.

Then, the insulation layer formed using a low-k material and/or a protection material is removed from the object by applying the composition to the object (S120). The low-k material and the protection material have been described previously, so description of those materials will be omitted here.

The object may be, for example, a substrate or a substrate on which a lower structure is formed. The substrate may be, for example, a silicon wafer, a silicon-on-insulator (SOI) substrate, etc. The lower structure may be, for example, a gate, a wiring, a capacitor, a contact, a pad, a plug, etc.

The insulation layer may comprise a low-k film comprising the low-k material, a protection film comprising the protection material, or a combination thereof. In an embodiment of the invention, the insulation layer comprises a low-k film and a protection film formed on the low-k film. As an example, the insulation layer may comprise a low-k film formed using carbon-doped silicon oxide (SiOCH) and a protection film formed on the low-k film using silicon carbonitride (SiCN). When a composition in accordance with an embodiment of the invention is applied to the object on which the insulation layer is formed, the oxidizing agent and the fluorine-containing compound may react with the low-k material and the protection material to simultaneously remove the low-k film and the protection film from the object.

Particularly, the oxidizing agent of the composition may react with the low-k material and the protection material to generate silicon oxide. Furthermore, the fluorine-containing compound of the composition may decompose the generated silicon oxide and remove it from the object. When those processes occur, the insulation layer is removed from the object as a result those processes.

The composition is applied to the object using a batch-type etching apparatus or a single-type etching apparatus.

When the temperature of the composition applied to the object is lower than about 15° C., the processing time needed to remove the insulation layer may increase excessively. In addition, when the temperature of the composition is higher than about 100° C., the rate at which the insulation layer is etched may not be readily controlled and thus the object, such as a silicon wafer, may be damaged by the composition. Therefore, when applied to the object, the composition preferably has a temperature of about 15° C. to 100° C., and more preferably has a temperature of about 40° C. to 90° C.

Next, whether or not the insulation layer has been removed from the object is determined using the naked eye or an electronic microscope (S130). When the insulation layer has not been completely removed from the object, the composition is applied to the object again to completely remove the insulation layer from the object.

Therefore, the insulation layer comprising the low-k film and/or the protection film may be effectively removed from the object using a composition in accordance with an embodiment of the invention.

Method of Recycling a Substrate

Figure 2:
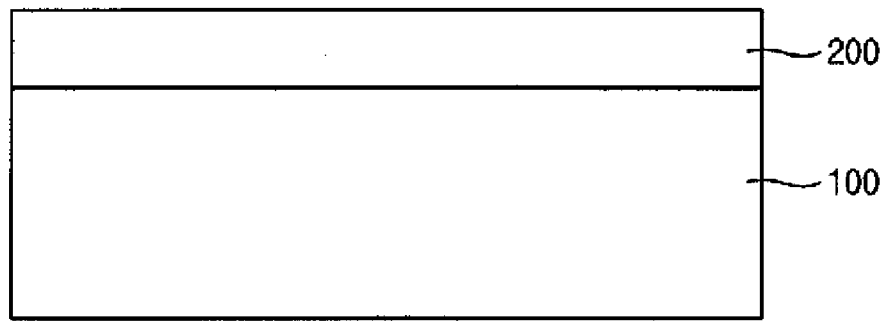
FIGS. 2 through 4 are cross-sectional views illustrating a method of recycling a substrate using a composition in accordance with an embodiment of the invention.
Figure 3:
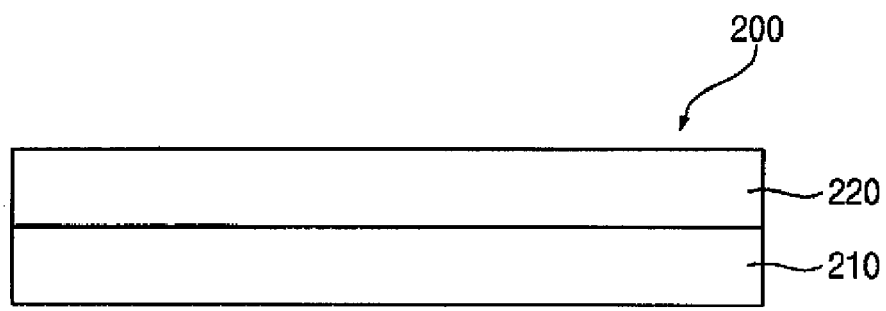
Figure 4:
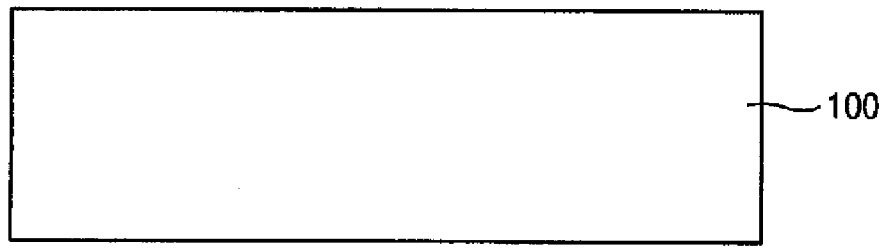

FIGS. 2 through 4 are cross-sectional views illustrating a method of recycling a substrate using a composition in accordance with an embodiment of the invention.

FIG. 2 is a cross-sectional view illustrating a step of forming an insulation layer 200 on a substrate 100. FIG. 3 is a cross-sectional view illustrating insulation layer 200 of FIG. 2.

Referring to FIG. 2, insulation layer 200 is formed on substrate 100. Substrate 100 may be, for example, a silicon wafer or a silicon-on-insulator (SOI) substrate.

Insulation layer 200 may comprise a low-k film, a protection film, or a combination thereof. The low-k film may be formed using a low-k material. For example, the low-k film may be formed using carbon-doped silicon oxide (SiOCH). The protection film may be formed using a protection material. For example, the protection film may be formed using silicon carbonitride (SiCN).

In the illustrated embodiment of FIG. 3, insulation layer 200 comprises low-k film 210 and protection film 220 formed on low-k film 210. As an example, the insulation layer may comprise low-k film 210 formed using carbon-doped silicon oxide (SiOCH), and protection film 220 formed on low-k film 210 using silicon carbonitride (SiCN).

FIG. 4 is a cross-sectional view illustrating a step of removing insulation layer 200 from substrate 100 using a composition in accordance with an embodiment of the invention.

Referring to FIG. 4, insulation layer 200 is removed from substrate 100 by applying the composition to substrate 100.

In more detail, a composition comprising about 1 to 50 percent by weight of an oxidizing agent, about 0.1 to 35 percent by weight of a fluorine-containing compound, and a remainder of water is applied to substrate 100 on which insulation layer 200 is formed. The composition has been described previously, so further description of the composition will be omitted here.

When a composition in accordance with an embodiment of the invention is applied to substrate 100 on which insulation layer 200 is formed, the oxidizing agent of the composition may react with the low-k material and the protection material to generate silicon oxide. Furthermore, the fluorine-containing compound of the composition may decompose the generated silicon oxide to remove insulation layer 200 from substrate 100.

When insulation layer 200 comprises low-k film 210 and protection film 220 formed on low-k film 210 in accordance with an embodiment of the invention, low-k film 210 and protection film 220 are simultaneously removed from substrate 100.

Additionally, substrate 100 may be rinsed using pure water so that remaining composition and other residuals may be removed from substrate 100. Further, substrate 100 may be dried so that remaining water may be removed from substrate 100.

The method of removing insulation layer 200 has been described previously with reference to FIG. 1, so further explanation of that process will be omitted here.

Substrate 100 may be economically recycled (i.e., cost-effectively recycled) by removing insulation layer 200 from substrate 100 using a composition in accordance with an embodiment of the invention. Insulation layer 200 is removed through a wet etching process to prevent the damage that a dry etching process causes to substrate 100. Therefore, the cost of a semiconductor manufacturing process may be reduced and process efficiency may be increased.

Compositions, in accordance with embodiments of the invention, which are used for removing an insulation material, will be described hereinafter with reference to "Examples" and in comparison to a "Comparative Example". Evaluations of the performances of the compositions will also be described.

Preparation of a Composition for Removing an Insulation Material

Example 1

A composition for removing an insulation material was prepared by mixing about 10 percent by weight of hydrogen fluoride, about 10 percent by weight of ammonium persulfate, and a remainder of pure water, based on the total weight of the composition. The temperature of the composition was maintained at about 50° C.

Examples 2 through 13

Compositions for removing an insulation material were prepared through processes substantially the same as those for forming Example 1 except for the type, or the types and total percentage by weight, of the oxidizing agent(s) in each composition. For each of Examples 1 through 37, Table 1 shows the type(s) and percentage(s) by weight of the oxidizing agent(s) and the fluorine-containing compound used in each exemplary composition, and the temperature of each exemplary composition.

Examples 14 through 37

Compositions for removing an insulation material were prepared through processes substantially the same as those for forming Example 1 except that, for each composition, one or more of the following was varied: the type of oxidizing agent, the type of fluorine-containing compound, the percentage by weight of oxidizing agent, the percentage by weight of fluorine-containing compound, and the composition temperature.

Comparative Example 1

A composition for removing an insulation layer was prepared by mixing about 10 percent by weight of hydrogen fluoride and a remainder of pure water. The temperature of the composition was maintained at about 50° C. For Comparative Example 1, Table 1 shows the type and percentage by weight of the fluorine-containing compound, the temperature of the composition, and the fact that the composition contained no oxidizing agent.

TABLE 1

| | Fluorine-Containing Compound [wt %] | | Oxidizing Agent [wt %] | | Temperature [° C.] |
|---|---|---|---|---|---|
| Example 1 | HF | 10 | $(NH_4)_2S_2O_8$ | 10 | 50 |
| Example 2 | HF | 10 | $H_2O_2$ | 10 | 50 |
| Example 3 | HF | 10 | $HNO_3$ | 10 | 50 |
| Example 4 | HF | 10 | $H_2SO_4$ | 10 | 50 |
| Example 5 | HF | 10 | $H_3PO_4$ | 10 | 50 |
| Example 6 | HF | 10 | $HClO_4$ | 10 | 50 |
| Example 7 | HF | 10 | $FeCl_3$ | 10 | 50 |
| Example 8 | HF | 10 | $CH_3COOH$ | 10 | 50 |
| Example 9 | HF | 10 | $H_2O_2$ $HNO_3$ | 10 10 | 50 |
| Example 10 | HF | 10 | $H_2O_2$ $H_2SO_4$ | 10 10 | 50 |
| Example 11 | HF | 10 | $H_2O_2$ $H_3PO_4$ | 10 10 | 50 |
| Example 12 | HF | 10 | $HNO_3$ $H_2SO_4$ | 10 10 | 50 |
| Example 13 | HF | 10 | $HNO_3$ HCl | 10 10 | 50 |
| Example 14 | HF | 5 | $H_2O_2$ | 10 | 80 |
| Example 15 | HF | 10 | $H_2O_2$ | 10 | 80 |
| Example 16 | HF | 10 | $HNO_3$ | 10 | 80 |
| Example 17 | HF | 10 | $H_2SO_4$ | 10 | 80 |
| Example 18 | HF | 1 | $(NH_4)_2S_2O_8$ | 10 | 80 |
| Example 19 | HF | 5 | $(NH_4)_2S_2O_8$ | 10 | 80 |
| Example 20 | HF | 10 | $(NH_4)_2S_2O_8$ | 10 | 80 |
| Example 21 | HF | 20 | $(NH_4)_2S_2O_8$ | 10 | 80 |
| Example 22 | HF | 30 | $(NH_4)_2S_2O_8$ | 10 | 80 |
| Example 23 | HF | 10 | $(NH_4)_2S_2O_8$ | 2 | 80 |
| Example 24 | HF | 10 | $(NH_4)_2S_2O_8$ | 5 | 80 |
| Example 25 | HF | 10 | $(NH_4)_2S_2O_8$ | 10 | 80 |
| Example 26 | HF | 10 | $(NH_4)_2S_2O_8$ | 20 | 80 |
| Example 27 | HF | 10 | $(NH_4)_2S_2O_8$ | 30 | 80 |
| Example 28 | HF | 10 | $(NH_4)_2S_2O_8$ | 35 | 80 |
| Example 29 | HF | 10 | $(NH_4)_2S_2O_8$ | 10 | 70 |
| Example 30 | HF | 10 | $(NH_4)_2S_2O_8$ | 20 | 70 |
| Example 31 | HF | 10 | $(NH_4)_2S_2O_8$ | 30 | 70 |
| Example 32 | HF | 10 | $Na_2S_2O_8$ | 7 | 70 |
| Example 33 | HF | 10 | $K_2S_2O_8$ | 7 | 70 |
| Example 34 | HF | 10 | $(NH_4)_2S_2O_8$ | 20 | 50 |
| Example 35 | HF | 10 | $(NH_4)_2S_2O_8$ | 30 | 50 |
| Example 36 | $NH_4F$ | 10 | $(NH_4)_2S_2O_8$ | 30 | 50 |
| Example 37 | $NH_4F \cdot HF$ | 10 | $(NH_4)_2S_2O_8$ | 30 | 50 |
| Comparative Example 1 | HF | 10 | — | — | 50 |

Evaluation of Insulation Layer Removal Rate in Accordance with the Oxidizing Agent The rates at which the compositions in Examples 1 through 13 and Comparative Example 1 removed insulation layers were evaluated.

In the compositions prepared in Examples 1 through 13 and Comparative Example 1, a similar amount (about 10 percent by weight) of hydrogen fluoride was used as the fluorine-containing compound in each composition, but the presence of an oxidizing agent, and, if present, the type, or types and total amounts, of the oxidizing agent(s) varied among the compositions. Furthermore, the temperatures of the compositions were maintained at about 50° C. using a thermostat.

Insulation layer removal rates were evaluated using a low-k film and a protection film. To evaluate the removal of the low-k film, a carbon-doped silicon oxide (SiOCH) film having a thickness of about 4,400 Å was formed on bare silicon wafers. To evaluate a removal rate of the protection film, a silicon carbonitride (SiCN) film having a thickness of about 3,400 Å was formed on bare silicon wafers.

Silicon wafers on which the carbon-doped silicon oxide (SiOCH) film or the silicon carbonitride (SiCN) film was formed were respectively immersed in the compositions prepared in Examples 1 through 13 and Comparative Example 1 for about 30 minutes, and then the silicon wafers were rinsed using deionized water for about 1 minute. Additionally, the silicon wafers were completely dried using nitrogen gas. The success of the removal of the carbon-doped silicon oxide (SiOCH) film and the removal rate of the silicon carbonitride (SiCN) film were evaluated using the naked eye, an optical microscope, a thin film thickness measuring device, and a scanning electron microscope (SEM). F20 (trade name; manufactured by Filmetrics Co., Ltd., U.S.A.) was used as the thin film thickness measuring device, and S-4700 (trade name; manufactured by Hitachi Co., Ltd., Japan) was used as the SEM. The success of the removal of the carbon-doped silicon oxide (SiOCH) film and the removal rate of the silicon carbonitride (SiCN) film are shown in Table 2. In Table 2 "O" means that the film was successfully removed by the composition, and "X" means that the film was not successfully removed by the composition.

TABLE 2

| | Removal State of SiOCH | Removal Rate of SiCN [Å/30 min] |
|---|---|---|
| Example 1 | O | <250 |
| Example 2 | O | <100 |
| Example 3 | O | <100 |
| Example 4 | O | <100 |
| Example 5 | O | <100 |
| Example 6 | O | <100 |
| Example 7 | O | <100 |
| Example 8 | O | <100 |
| Example 9 | O | <100 |
| Example 10 | O | <100 |
| Example 11 | O | <100 |
| Example 12 | O | <100 |
| Example 13 | O | <100 |
| Comparative Example 1 | X | X |

As shown in Table 2, the compositions comprising an oxidizing agent, which were prepared in Examples 1 to 13 in accordance with embodiments of the invention, removed the carbon-doped silicon oxide (SiOCH) film and the silicon carbonitride (SiCN) film efficiently. However, the composition that did not comprise the oxidizing agent, which was prepared in Comparative Example 1, did not remove the carbon-doped silicon oxide (SiOCH) film or the silicon carbonitride (SiCN) film. Therefore, it was confirmed that compositions that comprise an oxidizing agent, in accordance with embodiments of the invention, might remove the carbon-doped silicon oxide (SiOCH) film and the silicon carbonitride (SiCN) film more effectively.

In addition, the silicon carbonitride (SiCN) film removal rates, in accordance with the type(s) of oxidizing agent used, were compared with one another. Each of the compositions prepared in Examples 1 to 13 removed the silicon carbonitride (SiCN) films at a rate of less than about 100 Å/30 min or less than about 250 Å/30 min. Particularly, the compositions prepared in Examples 2 to 13 had removal rates of less than about 100 Å/30 min and the composition comprising ammonium persulfate as the oxidizing agent, which was the composition prepared in Example 1, had a removal rate less than about 250 Å/30 min. Therefore, it was noted that the composition comprising a peroxy acid compound such as ammonium persulfate might remove the silicon carbonitride (SiCN) film more effectively than a composition comprising one or two types of oxidizing agents other than a peroxy acid compound.

Evaluation of Removal Time of an Insulation Layer

The amount of time required to remove a carbon-doped silicon oxide (SiOCH) film and the amount of time required to remove a silicon carbonitride (SiCN) film were evaluated for the compositions prepared in Example 1, Examples 14 through 37, and Comparative Example 1.

The carbon-doped silicon oxide (SiOCH) film and the silicon carbonitride (SiCN) film were formed by processes substantially the same as those described above with reference to the evaluation of the insulation layer removal rates.

After the silicon wafers on which a carbon-doped silicon oxide (SiOCH) film or a silicon carbonitride (SiCN) film was formed were immersed in the compositions prepared in Example 1, Examples 14 through 37, and Comparative Example 1, respectively, for a predetermined amount of time, the silicon wafers were rinsed using deionized water for about 1 minute. The silicon wafers were also completely dried using nitrogen gas. Then, whether or not the carbon-doped silicon oxide (SiOCH) film and the silicon carbonitride (SiCN) film were completely removed was determined for each wafer. Also, the amount of time required to completely remove the carbon-doped silicon oxide (SiOCH) film or the silicon carbonitride (SiCN) film was measured. Removal of the carbon-doped silicon oxide (SiOCH) film or the silicon carbonitride (SiCN) film was confirmed using the naked eye, an optical microscope, a thin film thickness measuring device, and a scanning electron microscope (SEM). F20 (trade name; manufactured by Filmetrics Co., Ltd., U.S.A.) was used as the thin film thickness measuring device, and S-4700 (trade name; manufactured by Hitachi Co., Ltd., Japan) was used as the SEM. The removal time for the carbon-doped silicon oxide (SiOCH) film and the silicon carbonitride (SiCN) film is shown in Table 3.

TABLE 3

| | Removal Time of a SiOCH Film [min] | Removal Time of a SiCN Film [min] |
|---|---|---|
| Example 1 | <10 | 270 |
| Example 14 | <20 | >10 hr |
| Example 15 | <20 | >10 hr |
| Example 16 | <20 | >10 hr |
| Example 17 | <20 | >10 hr |
| Example 18 | <15 | 400 |
| Example 19 | <10 | 90 |
| Example 20 | <10 | 40 |
| Example 21 | <10 | 20 |
| Example 22 | <10 | 7 |
| Example 23 | <15 | 250 |
| Example 24 | <10 | 90 |
| Example 25 | <10 | 50 |
| Example 26 | <10 | 25 |
| Example 27 | <10 | 10 |
| Example 28 | <10 | 7 |
| Example 29 | <10 | 80 |
| Example 30 | <10 | 40 |
| Example 31 | <10 | 15 |
| Example 32 | <10 | 90 |
| Example 33 | <10 | 150 |
| Example 34 | <10 | 170 |
| Example 35 | <10 | 110 |
| Example 36 | <15 | 500 |
| Example 37 | <15 | 550 |
| Comparative Example 1 | Not Removed | Not Removed |

Evaluation of Removal Time of an Insulation Layer Depending on Content and Type of a Fluorine-Containing Compound To evaluate insulation layer removal time in accordance with the percentage by weight of a fluorine-containing compound, the compositions prepared in Examples 18 through 22 (referred to hereafter as Group I) were compared with one another. Each composition in Group I comprised a substantially similar type of oxidizing agent, a substantially similar percentage by weight of the oxidizing agent, and a substantially similar temperature compared to the other compositions in Group I. To evaluate an insulation layer removal time in accordance with the type of fluorine-containing compound that the composition comprised, the compositions prepared in Examples 35 through 37 (referred to hereafter as Group II) were compared with one another. Each composition in Group II comprised substantially the same percentage by weight of the fluorine-containing compound, type of oxidizing agent, percentage by weight of the oxidizing agent, and temperature.

As shown in Table 3, removal times for the silicon carbonitride (SiCN) film were reduced in accordance with an increase in the percentage by weight of the fluorine-containing compound in Group I. Also, as shown in Table 3, the removal times for the carbon-doped silicon oxide (SiOCH) film were less when the percentage by weight of the fluorine-containing compound in the compositions of Group I was greater than 1 percent compared to when the percentage by weight was one percent. In particular, when the content of the fluorine-containing compound increased from about 1 percent by weight to about 30 percent by weight, the removal time of the silicon carbonitride (SiCN) film was greatly reduced from about 400 minutes to about 7 minutes.

In Group II, the composition comprising hydrogen fluoride as the fluorine-containing compound, which was prepared in Example 35, rapidly removed the carbon-doped silicon oxide (SiOCH) film and the silicon carbonitride (SiCN) film compared to the compositions comprising ammonium fluoride or ammonium bifluoride as the fluorine-containing compound, which were prepared in Examples 36 and 37, respectively. Particularly, the composition comprising hydrogen fluoride as the fluorine-containing compound, which was prepared in Example 35, removed the silicon carbonitride (SiCN) film was much more quickly than the compositions comprising ammonium fluoride or ammonium bifluoride as the fluorine-containing compound, which were prepared in Examples 36 and 37, respectively.

Evaluation of Insulation Layer Removal Time in Accordance with the Type of an Oxidizing Agent To evaluate insulation layer removal time in accordance with the existence or absence of an oxidizing agent, the compositions prepared in Example 1 and Comparative Example 1 (referred to hereafter as Group III) were compared with each other. To evaluate insulation layer removal time in accordance with the type of oxidizing agent, the compositions prepared in Examples 14 through 17 and Example 25 (referred to hereafter as Group IV) were compared with one another. To evaluate removal time of an insulation layer in accordance with types of a peroxy acid, the compositions prepared in Examples 29, 32, and 33 (referred to hereafter as Group V) were compared with one another.

In Group III, the composition that did not comprise the oxidizing agent, which was prepared in Comparative Example 1, removed very little of the carbon-doped silicon oxide (SiOCH) film or the silicon carbonitride (SiCN) film, even after one day had passed. However, the composition comprising ammonium persulfate as the oxidizing agent completely removed the carbon-doped silicon oxide (SiOCH) film and the silicon carbonitride (SiCN) film within about 10 minutes and within about 270 minutes, respectively.

Figure 5:
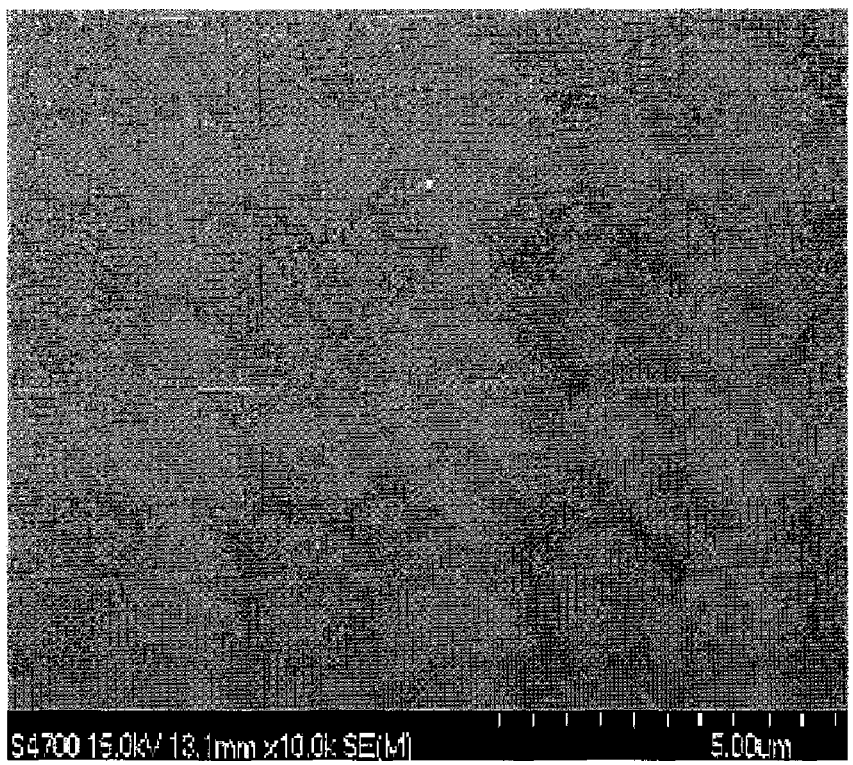
FIG. 5 is an SEM picture showing a surface of a substrate from which a silicon carbonitride (SiCN) film was removed using the composition prepared in Example 1; and, FIG. 6 is an SEM picture showing a surface of a substrate after the composition prepared in Comparative Example 1 was applied to the substrate, on which a silicon carbonitride (SiCN) film was formed.
Figure 6:
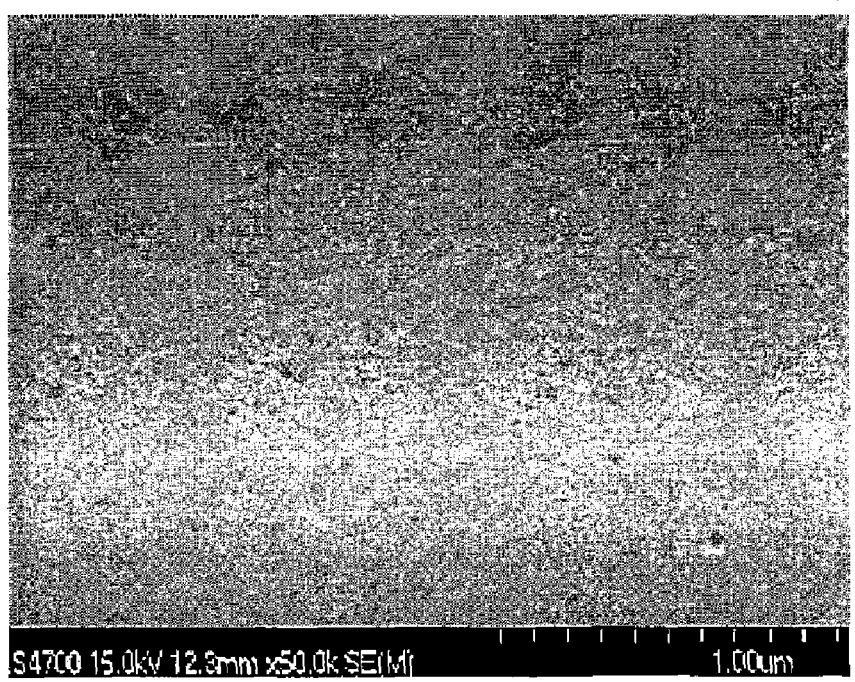

FIG. 5 is an SEM picture showing a surface of a substrate from which a silicon carbonitride (SiCN) film was removed using the composition prepared in Example 1. FIG. 6 is an SEM picture showing a surface of a substrate after the composition prepared in Comparative Example 1 was applied to the substrate, on which a silicon carbonitride (SiCN) film was formed.

Referring to FIGS. 5 and 6, the composition prepared in Comparative Example 1 did not remove the silicon carbonitride (SiCN) film, and the silicon carbonitride (SiCN) film remained on the silicon wafer. However, the silicon carbonitride (SiCN) film was completely removed from the silicon wafer by the composition prepared in Example 1, and the silicon wafer was thereby exposed. Furthermore, the silicon wafer of FIG. 5 was not substantially damaged by the process of removing the silicon carbonitride (SiCN) film. Therefore, it was confirmed that the silicon carbonitride (SiCN) film might be removed without damaging the silicon wafer by properly adjusting the type and percentage by weight of the fluorine-containing compound, the type and percentage by weight of the oxidizing agent, and the temperature of the composition, and removal time.

In Group IV, the compositions comprising hydrogen peroxide, nitric acid, sulfuric acid, or ammonium persulfate as the oxidizing agent, which were prepared in Examples 14 through 17 and Example 25, removed the carbon-doped silicon oxide (SiOCH) film within about 10 to 20 minutes. The silicon carbonitride (SiCN) film removal time for the compositions comprising hydrogen peroxide, nitric acid, or sulfuric acid as the oxidizing agent, which were prepared in Examples 14 through 17, was longer than about 10 hours. However, the composition comprising ammonium persulfate, which was prepared in Example 25, removed the silicon carbonitride (SiCN) film in about 50 minutes. Therefore, it was noted that the composition comprising the peroxy acid compound such as ammonium persulfate as the oxidizing agent might rapidly remove the silicon carbonitride (SiCN) film.

In Group V, insulation layer removal time was evaluated in accordance with the types of the peroxy acid compound. The compositions comprising ammonium persulfate, sodium persulfate, or potassium persulfate, which were prepared in Examples 29, 32, and 33, removed the carbon-doped silicon oxide (SiOCH) film and the silicon carbonitride (SiCN) film within a relatively short amount of time. In particular, the composition comprising the peroxy acid compound as the oxidizing agent removed the silicon carbonitride (SiCN) film within about 80 to 150 minutes. Thus, it was confirmed that the composition comprising the peroxy acid compound as the oxidizing agent removed the silicon carbonitride (SiCN) film much faster than the compositions comprising hydrogen peroxide, nitric acid, or sulfuric acid as the oxidizing agent.

Evaluation of Insulation Layer Removal Time in Accordance with the Percentage by Weight of Ammonium Persulfate To evaluate insulation layer removal time in accordance with the percentage by weight of ammonium persulfate, the compositions prepared in Examples 23 through 28 (referred to hereafter as Group VI) were compared with one another. The types and percentages by weight of the fluorine-containing compound, and temperatures of the compositions were substantially the same for all of the compositions in Group VI.

In Group VI, the removal times for the carbon-doped silicon oxide (SiOCH) film and the silicon carbonitride (SiCN) film decreased as the percentage by weight of ammonium persulfate increased. Particularly, removal time for the silicon carbonitride (SiCN) film was greatly reduced from about 250 to 7 minutes as the content of ammonium persulfate increased from about 2 to 35 percent by weight.

Evaluation of Insulation layer Removal Time in Accordance with the Temperature of a Composition Insulation layer removal time in accordance with the temperature of a composition was evaluated for the compositions comprising ammonium persulfate as the oxidizing agent. The compositions prepared in Examples 1, 25 through 27, 29 through 31, 34, and 35 (referred to hereafter as Group VII) were compared with one another.

The temperatures of the compositions prepared in Examples 1, 34, and 35 were maintained at about 50° C. The temperatures of the compositions prepared in Examples 25 through 27 were maintained at about 80° C. The temperatures of the compositions prepared in Examples 29 through 31 were maintained at about 70° C.

In Group VII, the carbon-doped silicon oxide (SiOCH) films were rapidly removed within about 10 minutes using the compositions having temperatures of about 50° C., about 70° C., or about 80° C. It was confirmed that removal time of the silicon carbonitride (SiCN) film decreased as the temperature of the composition increased from about 50° C. to about 80° C.

In accordance with embodiments of the invention, a composition may effectively remove an insulation layer such as a low-k film and a protection film from a substrate. For purposes of economic efficiency, the substrate may be recycled by removing the insulation layer from the substrate using the composition. The insulation layer is removed through a wet etching process so that the damage caused to a substrate through a dry etching process may be prevented. Furthermore, the cost of a recycling process may be reduced. Therefore, in accordance with embodiments of the invention, the efficiency of a semiconductor manufacturing process may be increased and the manufacturing cost may be decreased.

Although embodiments of the invention have been described herein, those skilled in the art will readily appreciate that many modifications may be made to the embodiments without materially departing from the scope of the present invention as defined by the accompanying claims.

What is claimed is:

1. A composition adapted for removing an insulation material comprising silicon carbonitride (SiCN) from a substrate, the composition comprising:
about 1 to 50 percent by weight of an oxidizing agent;
about 0.1 to 35 percent by weight of a fluorine-containing compound; and water,
wherein the oxidizing agent comprises a peroxy acid compound including at least one substance selected from the group consisting of ammonium persulfate, sodium persulfate, potassium persulfate, peroxynitric acid, peroxyphosphoric acid, peroxysulfuric acid, peroxyboric acid, sodium peroxyborate, peroxyformic acid, peroxyacetic acid, peroxybenzoic acid, and peroxyphthalic acid.

2. The composition of claim 1, wherein the composition comprises:
about 2 to 50 percent by weight of the oxidizing agent; and
about 1 to 35 percent by weight of the fluorine-containing compound.

3. The composition of claim 1, wherein the fluorine-containing compound comprises hydrogen fluoride.

4. The composition of claim 3, wherein an amount of hydrogen fluoride is greater than or equal to about 5 percent by weight.

5. The composition of claim 1, wherein the peroxy acid compound comprises ammonium persulfate (($NH_4$)$_2S_2O_8$).

6. The composition of claim 1, wherein an amount of the peroxy acid compound is greater than or equal to about 5 percent by weight.

7. The composition of claim 1, wherein the oxidizing agent further comprises at least one substance selected from the group consisting of a peroxide compound, an oxy acid compound, a metal salt, and an acid.

8. The composition of claim 1, wherein the fluorine-containing compound comprises at least one substance selected from the group consisting of hydrogen fluoride, ammonium fluoride, ammonium bifluoride, sodium fluoride, sodium hydrogen fluoride, barium fluoride, potassium fluoride, and ammonium fluoroborate.

9. The composition of claim 1, wherein the insulation material further comprises at least one low-k material selected from the group consisting of carbon-doped silicon oxide (SiOCH), silicon oxycarbide (SiOC), and hydrogenated silicon oxide (SiOH).

10. The composition of claim 1, wherein the insulation material further comprises at least one substance selected from the group consisting of silicon nitride (SiN), and silicon carbide (SiC).

11. The composition of claim 1, wherein the substrate comprises a silicon wafer or a silicon-on-insulator (SOI) substrate.

12. A composition adapted for removing an insulation material comprising silicon carbonitride (SiCN) from a substrate, the composition comprising:
about 1 to 50 percent by weight of a peroxy acid compound;
about 0.1 to 35 percent by weight of hydrogen fluoride; and water,
wherein the peroxy acid compound comprises at least one of ammonium persulfate, sodium persulfate, and potassium persulfate.

13. The composition of claim 12, wherein an amount of hydrogen fluoride is greater than or equal to about 5 percent by weight.

14. The composition of claim 12, wherein an amount of the peroxy acid compound is greater than or equal to about 5 percent by weight.

15. The composition of claim 12, wherein the composition comprises:
about 2 to 50 percent by weight of the peroxy acid compound; and
about 1 to 35 percent by weight of the hydrogen fluoride.

16. The composition of claim 12, wherein the peroxy acid compound comprises ammonium persulfate (($NH_4$)$_2S_2O_8$).

17. The composition of claim 12, wherein the peroxy acid compound further comprises at least one substance selected from the group consisting of a peroxide compound, an oxy acid compound, a metal salt, and an acid.

18. The composition of claim 12, wherein the insulation material further comprises at least one low-k material selected from the group consisting of carbon-doped silicon oxide (SiOCH), silicon oxycarbide (SiOC), and hydrogenated silicon oxide (SiOH).

19. The composition of claim 12, wherein the insulation material further comprises at least one substance selected from the group consisting of silicon nitride (SiN), and silicon carbide (SiC).

20. The composition of claim 12, wherein the substrate comprises a silicon wafer or a silicon-on-insulator (SOI) substrate.

* * * * *